United States Patent
Park et al.

(10) Patent No.: US 8,384,489 B2
(45) Date of Patent: Feb. 26, 2013

(54) SERPENTINE MICRO-STRIP LINES CONFIGURED IN AN AGGRESSOR/VICTIM TYPE TRANSMISSION LINE STRUCTURE

(75) Inventors: Hong-June Park, Pohang-si (KR); Kyoung-Ho Lee, Pohang-si (KR)

(73) Assignee: Postech Academy-Industry Foundation, Pohang-Si (KR)

( * ) Notice: Subject to any disclaimer, the term of this patent is extended or adjusted under 35 U.S.C. 154(b) by 274 days.

(21) Appl. No.: 12/682,771

(22) PCT Filed: Jan. 25, 2008

(86) PCT No.: PCT/KR2008/000464
§ 371 (c)(1),
(2), (4) Date: Apr. 12, 2010

(87) PCT Pub. No.: WO2009/057856
PCT Pub. Date: May 7, 2009

(65) Prior Publication Data
US 2010/0207700 A1    Aug. 19, 2010

(30) Foreign Application Priority Data
Oct. 29, 2007    (KR) .................. 10-2007-0108630

(51) Int. Cl.
*H01P 3/08*    (2006.01)
(52) U.S. Cl. .......................................... 333/1; 333/238

(58) Field of Classification Search .................. 333/1, 4, 333/5, 33, 238, 116
See application file for complete search history.

(56) References Cited

U.S. PATENT DOCUMENTS

| | | | | |
|---|---|---|---|---|
| 3,345,585 A | * | 10/1967 | Hildebrand | 333/116 |
| 4,130,723 A | * | 12/1978 | Wakeling | 174/36 |
| 7,397,320 B1 | * | 7/2008 | Bokhari | 333/1 |
| 2004/0239438 A1 | | 12/2004 | Benham et al. | |
| 2004/0263281 A1 | * | 12/2004 | Podell | 333/116 |
| 2007/0040634 A1 | | 2/2007 | Kanno et al. | |

FOREIGN PATENT DOCUMENTS

| | | |
|---|---|---|
| JP | 2004-186786 A | 7/2004 |
| KR | 1020060009375 A | 1/2006 |

* cited by examiner

*Primary Examiner* — Benny Lee
(74) *Attorney, Agent, or Firm* — Kile Park Goekjian Reed & McManus PLLC

(57) ABSTRACT

A micro-strip transmission line capable of reducing far-end crosstalk is provided. The micro-strip transmission line having a serpentine shape is capable of reducing the far-end crosstalk of the transmission line by increasing capacitive coupling between neighboring transmission lines by allowing parallel micro-strip transmission lines to have serpentine shapes. In the structure of the micro-strip transmission line having the serpentine shape, it is possible to reduce the far-end crosstalk of the transmission line by increasing capacitive coupling between neighboring transmission lines by allowing parallel micro-strip transmission lines to have serpentine shapes.

14 Claims, 8 Drawing Sheets

FIG. 1    Conventional Micro-Strip Transmission Line
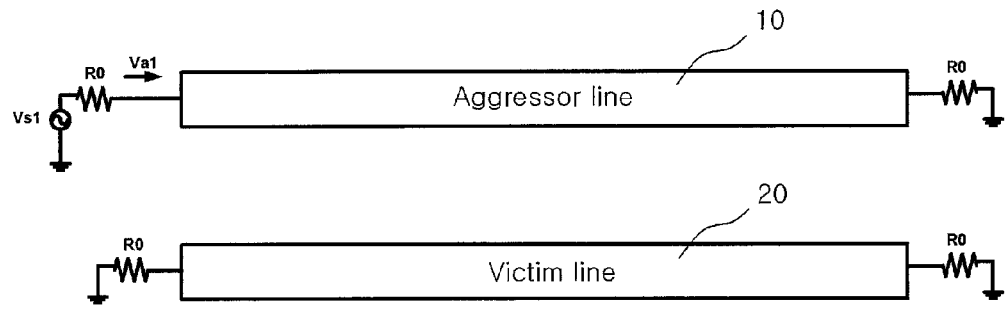
APPROVED: /BTL/
FIG. 2
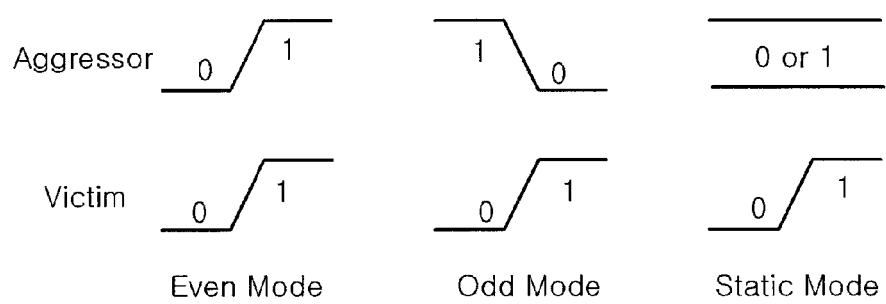

Even Mode          Odd Mode

SERPENTINE MICRO-STRIP LINES CONFIGURED IN AN AGGRESSOR/VICTIM TYPE TRANSMISSION LINE STRUCTURE

BACKGROUND OF THE INVENTION

1. Field of the Invention

The present invention relates to a micro-strip transmission line capable of reducing far-end crosstalk, and more particularly, to a structure of a micro-strip transmission line having a serpentine shape for reducing far-end crosstalk of a transmission line by increasing capacitive coupling between neighboring transmission lines by allowing parallel micro-strip transmission lines to have serpentine shapes.

2. Description of the Related Art

Crosstalk is caused by electromagnetic interference between neighboring signal lines. When a high frequency signal is transmitted through two parallel long signal lines, signals transmitted through one or two signal lines mutually interfere with one another. A transmission loss is increased due to the crosstalk caused by the mutual interference.

Capacitive coupling caused by mutual capacitance and inductive coupling caused by mutual inductance occur between the two signal lines. Far-end crosstalk is caused by a difference between the capacitive coupling caused by the mutual capacitance and the inductive coupling caused by the mutual inductance.

FIG. 1 illustrates a structure of a conventional micro-strip transmission line.

In FIG. 1, two parallel micro-strip transmission lines 10 and 20 are shown. An end of each transmission line is terminated with a resistor having resistance R0 the same as the characteristic impedance of the transmission line.

A transmission line through which a signal is applied to an end (a sending end) thereof between two transmission lines is referred to as an aggressor line 10. The aggressor line 10 includes a voltage source vs1 and an applied voltage va1. The other transmission line through which a signal is not applied is referred to as a victim line 20. Far-end crosstalk $V_{FEXT}$ of the victim line 20 may be represented by Equation 1 as follows:

$$V_{FEXT}(t) = \frac{TD}{2} \cdot \left(\frac{C_m}{C_T} - \frac{L_m}{L_S}\right) \cdot \frac{\partial V_a(t-TD)}{\partial t}, \quad \text{[Equation 1]}$$

where, TD is a transmission time taken to transmit a signal through a transmission line, $C_m$ is mutual capacitance per unit length, $C_T$ is a sum of self capacitance per unit length and the mutual capacitance, $L_m$ is mutual inductance per unit length, and $L_S$ is self inductance per unit length. Here, $V_a(t)$ is a voltage applied to a sending-end of the aggressor line.

In case of a transmission line located in a homogeneous medium such as a strip line, a capacitive coupling amount is the same as an inductive coupling amount. Ideally, the far-end crosstalk becomes zero.

However, in case of a micro-strip line formed on a printed circuit board (PCB), the inductive coupling amount is greater than the capacitive coupling amount. Thus, the far-end crosstalk has a negative value. Although the strip-line transmission line can remove the far-end crosstalk, the strip-line transmission line has to use more layers of the PCB than the micro-strip line. Accordingly, costs are increased.

When independent signals are respectively applied to two parallel micro-strip lines, a case where two applied signals are changed to the same direction is referred to as an even mode, and a case where the two applied signals are changed to different directions is referred to an odd mode.

FIG. 2 illustrates concepts of even and odd modes. The combination of signals applied to a pair of coupled aggressor and victim transmission lines can be classified into three categories, as shown in FIG. 2. The even mode refers to the case where the two signals make transitions (i.e. 0, 1) in the same direction at a given instance of time. The odd mode refers to the case where the two signals make transitions in the opposite direction at a given instance of time (i.e. 0, 1 or 1, 0). The static mode refers to the case where one signal makes a transition (i.e. 0, 1) while the other signal does not change with time (i.e. 0 or 1).

Referring to FIG. 2, if an applied signal is increased with respect to time, far-end crosstalk has a negative pulse shape. Accordingly, the far-end crosstalk delays a signal change with respect to time in the even mode. On the contrary, the far-end crosstalk advances a signal change with respect to time in the odd mode.

That is, in the even mode, a signal transmission time is slightly increased. In the odd mode, the signal transmission time is slightly decreased. A difference in the signal transmission time between the even and odd modes is represented by Equation 2 as follows:

$$TD_{EVEN} - TD_{ODD} = l \cdot \sqrt{L_S C_T} \cdot \left(\frac{L_m}{L_S} - \frac{C_m}{C_T}\right) \quad \text{[Equation 2]}$$

where, l is a length of a transmission line, $TD_{EVEN}$ is a transmission time in an even mode, $TD_{ODD}$ is a transmission time in an odd mode, $C_m$ is mutual capacitance per unit length, $C_T$ is a sum of self capacitance per unit length and the mutual capacitance, $L_m$ is mutual inductance per unit length, and $L_s$ is self inductance per unit length.

FIG. 3 illustrates influences of crosstalk noise (shown by the dotted lines in FIG. 3) in even and odd modes.

Referring to FIG. 3, in a case where random data signals are applied to sending ends of two parallel micro-strip transmission lines, timing jitter due to a difference in rise-time at a receiving-end between even and odd modes which is caused by a difference in arriving time of signals between the even and odd modes occurs.

In methods of reducing the crosstalk effect occurring at the micro-strip transmission line, a spacing between signal lines is increased, or a guard trace is used. The guard trace is a structure for reducing coupling between neighboring signal lines by inserting a parallel trace between the signal lines. However, in the aforementioned methods, the micro-strip transmission lines occupy too large area in the PCB.

SUMMARY OF THE INVENTION

The present invention provides a structure of a micro-strip transmission line having a serpentine shape capable of reducing far-end crosstalk of a transmission line by increasing capacitive coupling between neighboring transmission lines by allowing parallel micro-strip transmission lines to have serpentine shapes.

According to an aspect of the present invention, there is provided a structure of a micro-strip transmission line having a serpentine shape, comprising: a first micro-strip transmission line; and a second micro-strop transmission line spaced apart from and parallel with the first micro-strip transmission line, wherein the first and second micro-strip transmission lines include at least one unit serpentine structure.

BRIEF DESCRIPTION OF THE DRAWINGS

FIG. 1 illustrates a structure of a conventional micro-strip transmission line.

FIG. 2 illustrates concepts of even and odd modes.

DETAILED DESCRIPTION OF THE INVENTION

Hereinafter, the present invention will be described in detail by explaining exemplary embodiments of the invention with reference to the attached drawings.

Figure 3:
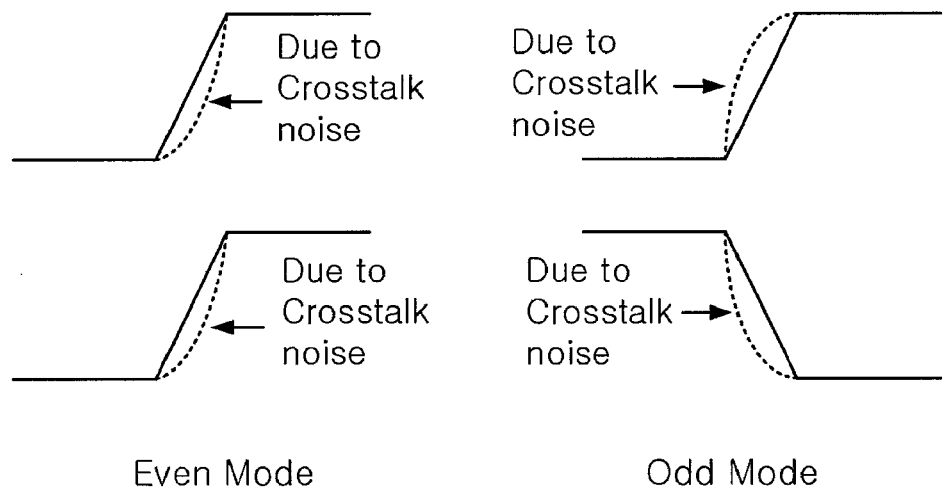
FIG. 3 illustrates influences of crosstalk noise in even and odd modes.
Figure 4:
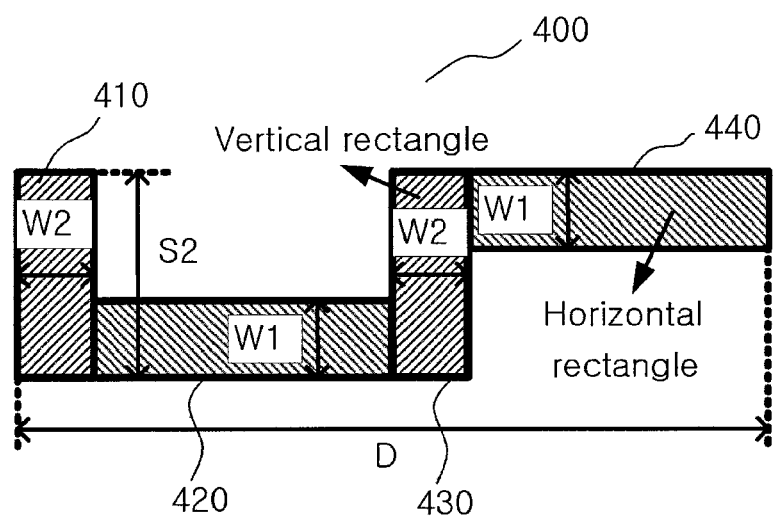
FIG. 4 illustrates a unit serpentine structure of a structure of a micro-strip transmission line having a serpentine shape according to an embodiment of the present invention.

FIG. 4 illustrates a unit serpentine structure of a structure of a micro-strip transmission line having a serpentine shape according to an embodiment of the present invention.

As shown in FIG. 4, a serpentine structure 400 according to the embodiment of the present invention includes a first vertical micro-strip transmission line 410, a first horizontal micro-strip transmission line 420, a second vertical micro-strip transmission line 430, and a second horizontal micro-strip transmission line 440. The second vertical micro-strip transmission line 430 has a predetermined length S2, a predetermined width W2, and a rectangular cross-section (shown as "vertical rectangle" in FIG. 4). The second horizontal micro-strip transmission line 440 has a predetermined width W1, a predetermined length, and a rectangular cross-section (shown as "horizontal rectangle" in FIG. 4).

Unlike a structure of conventional micro-strip transmission lines that are parallel straight lines, if a serpentine structure is used, mutual capacitance between neighboring signal lines is increased. In the serpentine structure, since a component perpendicular to a length direction of a micro-strip transmission line is perpendicular to a direction in which current proceeds, the mutual capacitance is increased, but the mutual inductance is not considerably increased.

Accordingly, as shown in FIG. 4, in the micro-strip transmission line including unit serpentine structures, the mutual inductance is not considerably increased, but the mutual capacitance is largely increased. Thus, far-end crosstalk and timing jitter caused by crosstalk are reduced.

At this time, as a section length D of the unit serpentine structure is decreased, that is, as a serpentine degree is increased, the capacitive coupling is increased. However, in a case where the section length D of the unit serpentine structure is too small, that is, the transmission lines are too serpentine, the capacitive coupling becomes greater than the inductive coupling.

Figure 5:
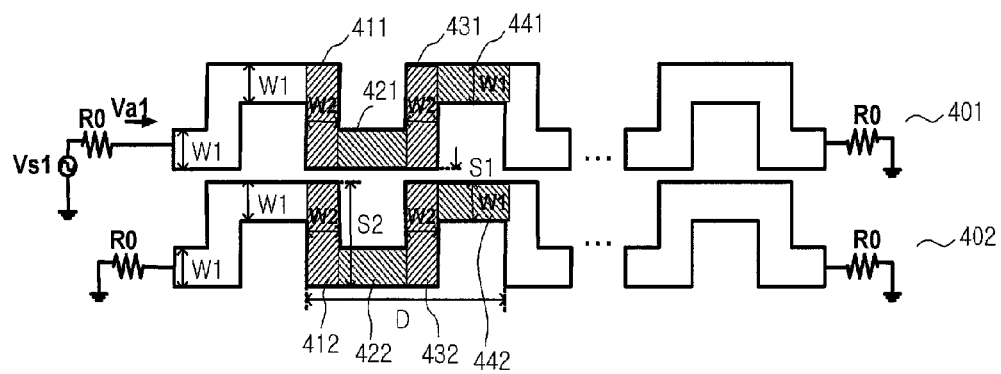
FIG. 5 illustrates a structure of a micro-strip transmission line having a serpentine shape which includes two micro-strip transmission lines according to an embodiment of the present invention.

FIG. 5 illustrates a structure of a micro-strip transmission line having a serpentine shape which includes two micro-strip transmission lines according to an embodiment of the present invention.

As shown in FIG. 5, the structure of the micro-strip transmission line having the serpentine shape according to the embodiment of the present invention includes a first micro-strip transmission line 401 and a second micro-strip transmission line 402 that is spaced apart from and parallel with the first micro-strip transmission line 401. The first micro-strip transmission line 401 includes a voltage source vs1 and an applied voltage va1. The first micro-strip transmission line 401 also has a resistor having resistance R0. The second micro-strip transmission line 402 also has a resistor having resistance R0.

At this time, the first and second micro-strip transmission lines 401 and 402 include a plurality of unit serpentine structures.

The unit serpentine structure has a section length D and is constructed with a first vertical micro-strip transmission line 411, 412, a first horizontal micro-strip transmission line 421, 422, a second vertical micro-strip transmission line 431, 432, and a second horizontal micro-strip transmission line 441, 442.

The first vertical micro-strip transmission line 411, 412 is perpendicular to length directions of the first and second micro-strip transmission lines 401 and 402. The first vertical micro-strip transmission line 411, 412 has a predetermined length S2, a predetermined width W2, and a rectangular cross section.

The first horizontal micro-strip transmission line 421, 422 has a terminal connected to a side of the first vertical micro-strip transmission line 411, 412 in a length direction of the first vertical micro-strip transmission line 411, 412. The first horizontal micro-strip transmission line 421, 422 is parallel with the length direction of the first and second micro-strip transmission lines 401 and 402. In addition, the first horizontal micro-strip transmission line 421, 422 have a predetermined length, a predetermined width W1, and a rectangular cross section.

The second vertical micro strip transmission line 431, 432 have a terminal connected to a terminal of the first horizontal micro-strip transmission line 421, 422 in a length direction of the second vertical micro strip transmission line 431, 432. The second vertical micro strip transmission line 431, 432 is perpendicular to the length direction of the first and second micro-strip transmission line 401 and 402. In addition, the second vertical micro-strip transmission line 431, 432 has a predetermined length, a predetermined width W2, and a rectangular cross section.

The second horizontal micro strip transmission line 441, 442 has a terminal connected to the other side of the second vertical micro-strip transmission line 431, 432 in a length direction of the second vertical micro-strip transmission line 431, 432. The second horizontal micro strip transmission line 441, 442 is parallel with the length direction of the first and second micro-strip transmission line 401 and 402. In addition, the second horizontal micro-strip transmission line 441, 442 has a predetermined length, a predetermined width W1, and a rectangular cross section.

In addition, the first vertical micro-strip transmission line 411, 412, the first horizontal micro-strip transmission line 421, 422, the second vertical micro-strip transmission line 431, 432, and the second horizontal micro-strip transmission line 441, 442 are successively arranged.

The first horizontal micro-strip transmission line 421 in the first micro-strip transmission line 401 is disposed nearest to the second micro-strip transmission line 402. The second horizontal micro-strip transmission line 441 in the first micro-strip transmission line 401 is disposed farthest from the second micro-strip transmission line 402.

On the other hand, the first horizontal micro-strip transmission line 422 in the second micro-strip transmission line 402 is disposed farthest from the first micro-strip transmission line 401. The second horizontal micro-strip transmission line 422 in the second micro-strip transmission line 402 is disposed nearest to the first micro-strip transmission line 401.

At this time, the first and second horizontal micro-strip transmission lines 421, 422 and 441, 442 have the same width W1. The first and second vertical micro-strip transmission lines 411, 412 and 431, 432 have the same width W2.

On the other hand, the first and second vertical micro-strip transmission lines 411, 412 and 431, 432 have the same length.

The first and second vertical micro-strip transmission lines 412 and 432 in the second micro-strip transmission line 402 are disposed at the same positions as the first and second vertical micro-strip transmission lines 411 and 431 in the first micro-strip transmission line 401 or disposed within the width W2 of the first vertical micro-strip transmission line 411 from the first and second vertical micro-strop transmission lines 411 and 431, in the length direction of the second micro-strip transmission line 402.

The second horizontal micro-strip transmission line 442 in the second micro-strip transmission line 402 is disposed at the same position as the second horizontal micro-strip transmission line 441 in the first micro-strip transmission line 401 or disposed within the width W2 of the first vertical micro-strip transmission line 411, in the length direction of the second micro-strip transmission line 402.

The width W2 of the first and second vertical micro-strip transmission lines 411 and 431 (412 and 432) may range from 0.1 to 5 times of the width W1 of the first and second horizontal micro-strip transmission lines 421, 422 and 441, 442.

The length S2 of the first and second vertical micro-strip transmission lines 411, 412 and 431, 432 may range from one to seven times of the width W1 of the first and second horizontal micro-strip transmission lines 421, 422 and 441, 442.

A spacing S1 between the first vertical micro-strip transmission line 411 in the first micro-strip transmission line 401 and the first vertical micro-strip transmission line 412 in the second micro-strip transmission line 402 may range from 0.0001 to 5 times of the width W1 of the first and second horizontal micro-strip transmission lines 421 and 441 (422 and 442).

In the structure of the micro-strip transmission line having the serpentine shape according to the embodiment of the present invention, it is possible to reduce cross talk at a receiving-end by reducing a difference between mutual capacitance and mutual inductance by adjusting a length D of the first micro-strip transmission line in the unit serpentine structure in the length direction of the first micro-strip transmission line.

Figure 6:
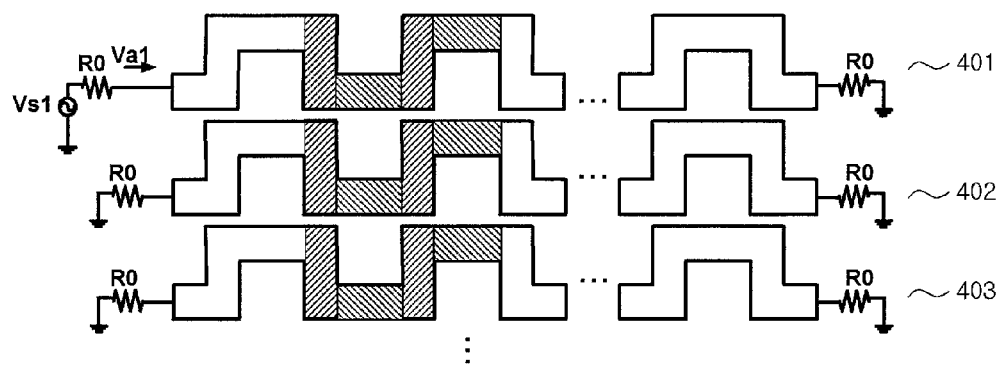
FIG. 6 illustrates a structure of a micro-strip transmission line having a serpentine shape which includes three or more micro-strip transmission lines according to another embodiment of the present invention.

FIG. 6 illustrates a structure of a micro-strip transmission line having a serpentine shape which includes three or more micro-strip transmission lines according to another embodiment of the present invention.

As shown in FIG. 6, the structure of the micro-strip transmission line having the serpentine shape according to the embodiment of the present invention may be constructed with three or more micro-strip transmission lines 401, 402, and 403. As shown in FIG. 6, the first micro-strip transmission line 401 includes a voltage source vs1 and an applied voltage va1. The first micro-strip transmission line 401 also has a resistor having resistance R0. The second micro-strip transmission line 402 also has a resistor having resistance R0. The third micro-strip transmission line 403 also has a resistor having resistance R0.

Figure 7:
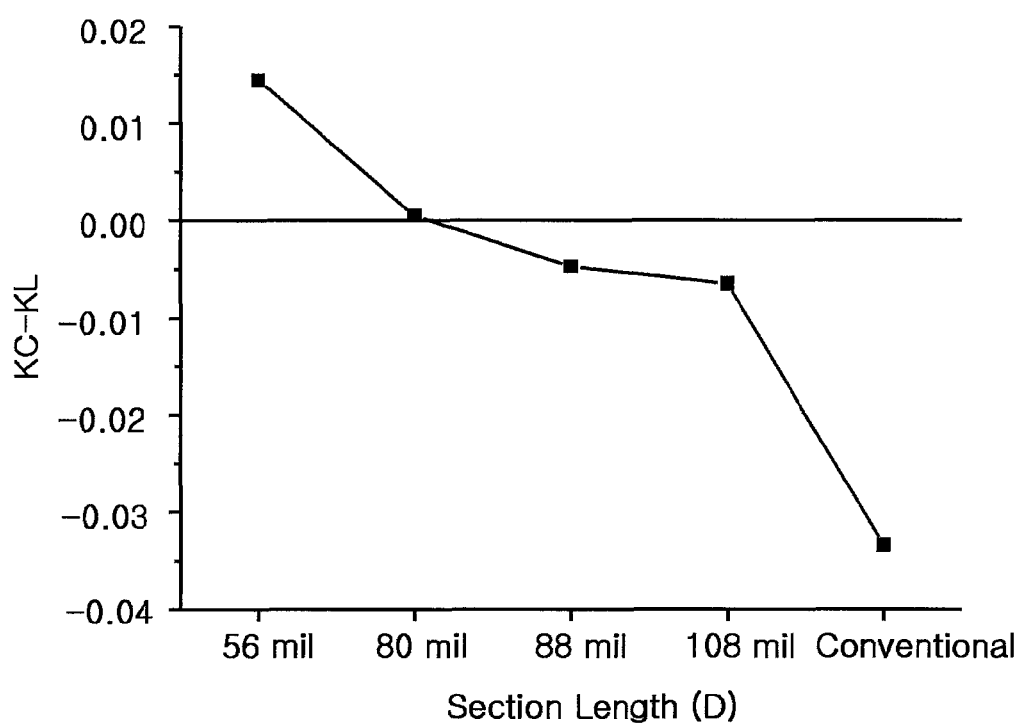
FIG. 7 illustrates a difference between a capacitive coupling ratio KC and an inductive coupling ratio KL based on a section length D of a unit serpentine structure.

FIG. 7 illustrates a difference between a capacitive coupling ratio ($KC=C_m/C_T$) and an inductive coupling ratio ($KL=L_m/L_S$) based on a section length D of a unit serpentine structure. FIG. 7 also illustrates a difference between a capacitive coupling ratio and an inductive coupling ratio for a conventional micro-strip transmission line (shown as "conventional" in FIG. 7).

A graph of FIG. 7 is obtained by calculating a difference between capacitive coupling and inductive coupling by using $L_S$, $L_m$, $C_T$, and $C_m$ obtained through a field solver simulation. Here, HFSS of the Ansoft Company is used as the field solver.

Widths W1 and W2 of the first and second micro-strip transmission lines are 14 mils. A spacing between the first and second micro-strip transmission lines is 19 mils. It is assumed that a printed circuit board (PCB) has two layers and that thicknesses of dielectric and copper members are 8 mils and 0.7 mils, respectively.

As the length D of the unit serpentine structure decreases, the capacitive coupling increases. In a case where the length D of the unit serpentine structure is 80 mils, the capacitive coupling is approximately the same as the inductive coupling. In a case where the length D of the unit serpentine structure is less than 80 mils, the capacitive coupling becomes greater than the inductive coupling.

Figure 8:
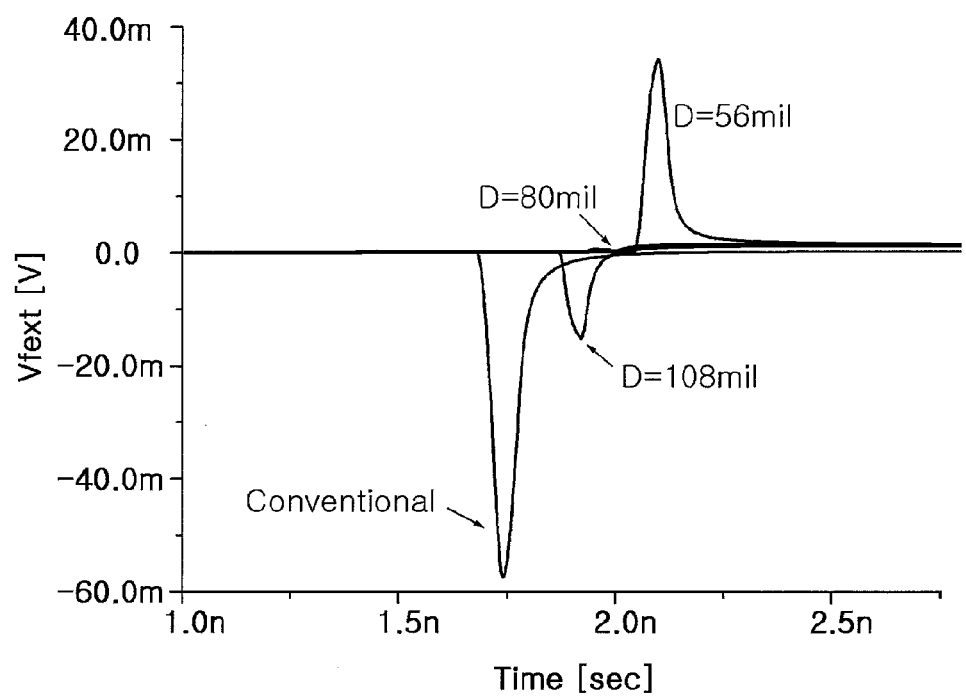
FIG. 8 illustrates a change of a waveform of a crosstalk voltage in a case where a length D of a unit serpentine structure is changed.

FIG. 8 illustrates a change of a waveform of a far-end crosstalk voltage, when a section length D of a unit serpentine structure is changed. The y-axis of the graph in FIG. 8 represents far-end crosstalk $V_{FEXT}$ in volts, and the x-axis of the graph represents time in seconds.

A graph of FIG. 8 is obtained by performing a SPICE (Simulation Program with Integrated Circuit Emphasis) simulation by using $L_S$, $L_m$, $C_T$, and $C_m$ obtained by using the field solver.

A length of the first and second micro-strip transmission lines is 8 inch. Both ends of all the transmission lines are terminated by using termination resistors of 50Ω that is the same as the characteristic impedance of the transmission lines. A voltage of 0.4 V having a rise-time of 50 ps is applied to the first micro-strip transmission line (aggressor line). A voltage waveform of far-end crosstalk is measured at an end of the second micro-strip transmission line (victim line). The far-end crosstalk voltage is reduced as compared with the conventional technique (shown as "conventional" in FIG. 8).

Specifically, in a case where the section length D of the unit serpentine structure is 80 mils, the far-end crosstalk is substantially removed. In a case where the section length D of the unit serpentine structure is 108 mils, the capacitive coupling is less than the inductive coupling. However, in a case where the section length D of the unit serpentine structure is 56 mils by allowing the micro-strip transmission lines to become serpentine too much, the capacitive coupling becomes greater than the inductive coupling. Positive far-end crosstalk occurs.

Figure 9:
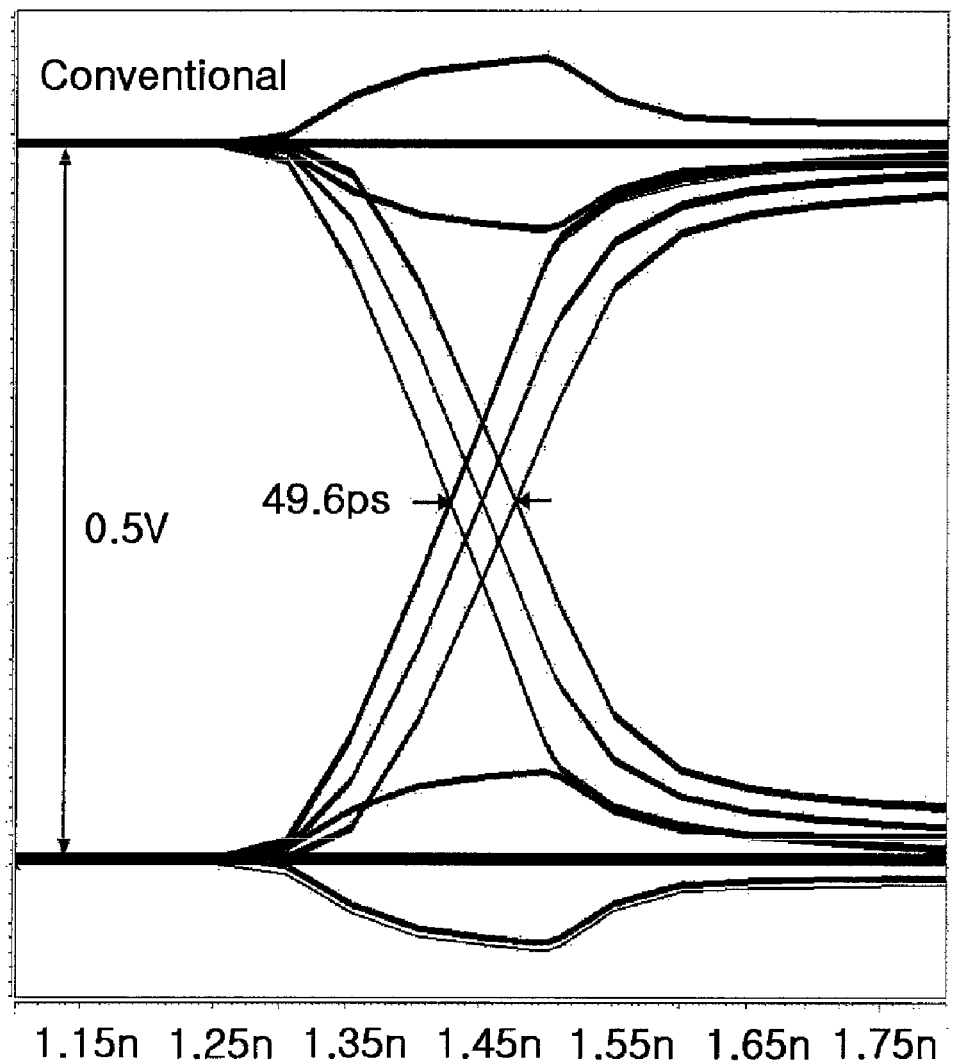
FIG. 9 is an eye-diagram of a micro transmission line according to a conventional technique.
Figure 10:
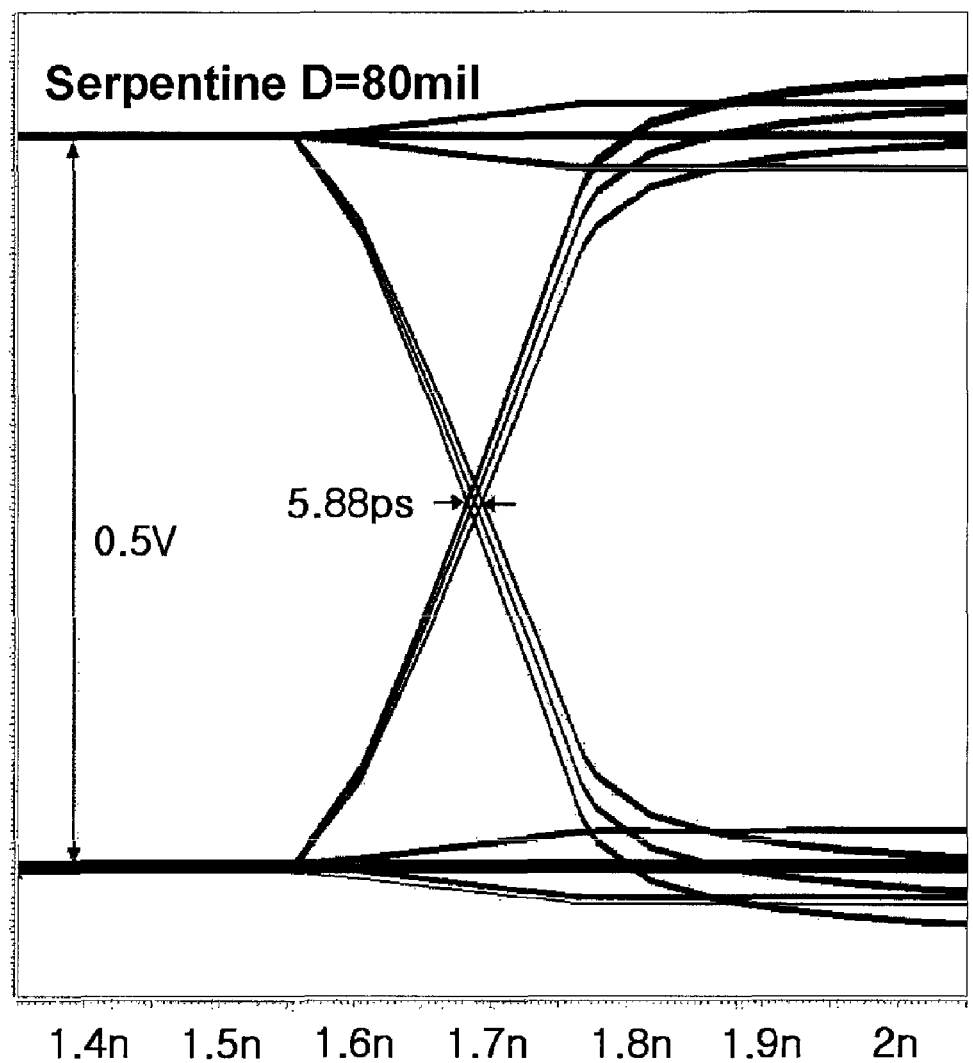
FIG. 10 is an eye-diagram of a structure of a micro-strip transmission line having a serpentine shape according to an embodiment of the present invention.

FIG. 9 is an eye-diagram of a micro-strip transmission line according to a conventional technique. FIG. 10 is an eye-diagram of a structure of a micro-strip transmission line having a serpentine shape of section length D=80 mils according to an embodiment of the present invention.

In FIG. 10, timing jitter caused by a difference in transmission time between even and odd modes is obtained through the SPICE simulation with respect to the structure of the micro-strip transmission line having the serpentine shape.

A 27-1 pseudo random binary sequence (PRBS) pattern and a 215-1 PRBS pattern are applied to sending ends of first and second micro-strip transmission lines (aggressor and victim lines), respectively. A waveform is measured at a receiving end of the second micro-strip transmission line (victim line). Timing jitter in an eye diagram of the structure of the micro-strip transmission line having the serpentine shape according to the embodiment of the present invention considerably decreases to 5.88 ps as compared with 49.6 ps in the conventional technique of FIG. 9. (The voltage swing used in the measurements shown in FIGS. 9 and 10 is 0.5 V.)

Figure 11:
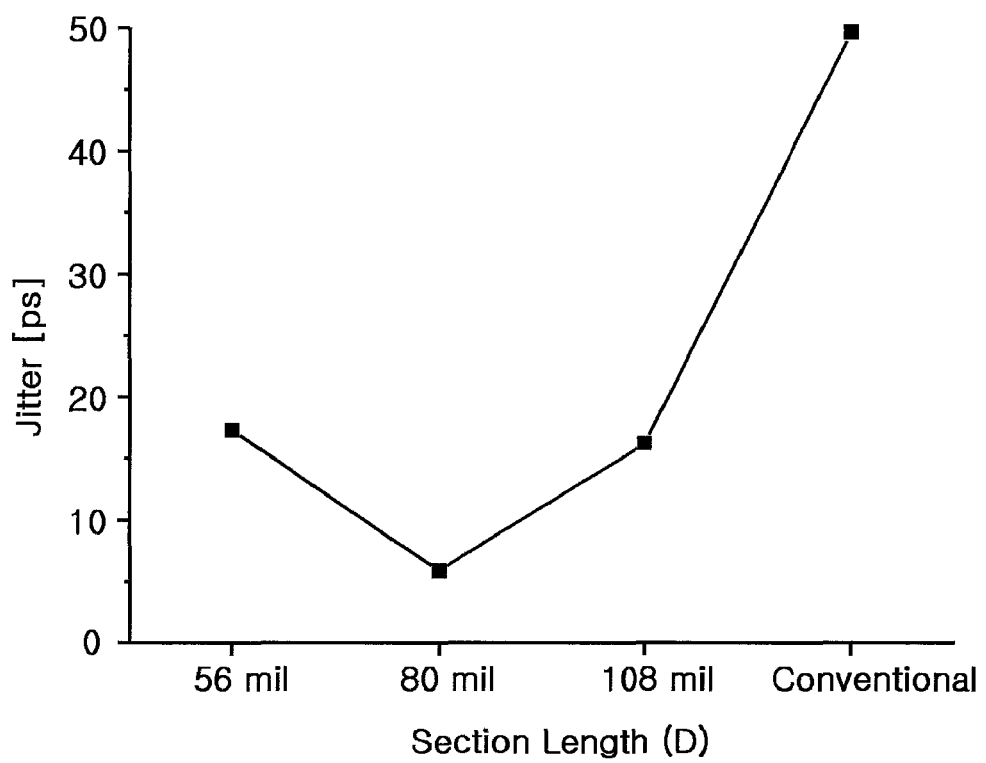
FIG. 11 illustrates timing jitter caused by a difference in transmission time between even and odd modes.

FIG. 11 illustrates a timing jitter due to difference in transmission time between even and odd modes. The y-axis of the graph in FIG. 11 represents jitter in ps, and the x-axis of the graph represents section length D in mils.

Referring to FIG. 11, in the present invention, timing jitter in ps is considerably reduced as compared with the conventional technique (shown as "conventional" in FIG. 11). Like the voltage waveform of far-end crosstalk, in a case where a section length D of a unit serpentine structure is 80 mils, the timing jitter is minimized. In a case where the length D of the unit serpentine structure becomes less than 80 mils, the timing jitter is increased. This is because the capacitive coupling is increased too much to become greater than the inductive coupling.

In a structure of a micro-strip transmission line having the serpentine shape according to an embodiment of the present invention, it is possible to reduce far-end crosstalk of the transmission lines by increasing capacitive coupling between neighboring transmission lines by allowing parallel micro-strip transmission lines to have serpentine shapes.

In addition, it is possible to reduce an area of a printed circuit board (PCB) and costs by efficiently reducing far-end crosstalk without increasing a spacing between two signals lines and without a guard trace.

In addition, it is possible to increase a signal transmission speed by reducing timing jitter caused by a difference in transmission time between even and odd modes by increasing only mutual capacitance without changing mutual inductance in the structure of the micro-strip transmission line having the serpentine shape according to an embodiment of the present invention.

While the present invention has been particularly shown and described with reference to exemplary embodiments thereof, it will be understood by those skilled in the art that various changes in form and details may be made therein without departing from the spirit and scope of the present invention as defined by the appended claims.

What is claimed is:

1. A structure of a micro-strip transmission line (MSTL) having a serpentine shape, comprising:
   a first MSTL; and
   a second MSTL spaced apart from and parallel with the first MSTL,
   wherein the first MSTL comprises a first unit serpentine structure and the second MSTL comprises a second unit serpentine structure,
   wherein each of the first and second unit serpentine structures comprises:
      a first vertical MSTL perpendicular to a length direction of the first and second MSTLs;
      a first horizontal MSTL comprising a terminal connected to a side of the first vertical MSTL, the first horizontal MSTL being parallel with the length direction of the first and second MSTLs;
      a second vertical MSTL comprising a side connected to the other terminal of the first horizontal MSTL, the second vertical MSTL being perpendicular to the length direction of the first and second MSTLs; and
      a second horizontal MSTL comprising a terminal connected to the other side of the second vertical MSTL, the second horizontal MSTL being parallel with the length direction of the first and second MSTLs,
      wherein the first vertical MSTL, the first horizontal MSTL, the second vertical MSTL, and the second horizontal MSTL are successively arranged, and
   wherein the first unit serpentine structure is arranged relative to the second unit serpentine structure such that:
      a spacing between the first vertical MSTL in the first unit serpentine structure and the first vertical MSTL in the second unit serpentine structure is between approximately 0.0001 to 5 times the width of the first horizontal MSTL in the first unit serpentine structure;
      a first vertical line is coincident with the first vertical MSTL in the first unit serpentine structure and the first vertical MSTL in the second unit serpentine structure;
      a second vertical line is coincident with the second vertical MSTL in the first unit serpentine structure and the second vertical MSTL in the second unit serpentine structure; and
      a first vertical distance between the first horizontal MSTL in the first unit serpentine structure and the first horizontal MSTL in the second unit serpentine structure is equal to a second vertical distance between the second horizontal MSTL in the first unit serpentine structure and the second horizontal MSTL in the second unit serpentine structure.

2. The structure of the micro-strip transmission line of claim 1, wherein the spacing between the first vertical MSTL in the first unit serpentine structure and the first vertical MSTL in the second unit serpentine structure is between approximately 0.0001 to 2 times the width of the first horizontal MSTL in the first unit serpentine structure.

3. The structure of the micro-strip transmission line of claim 1,
   wherein the first horizontal MSTL in the first unit serpentine structure is disposed nearest to the second MSTL, and
   wherein the second horizontal MSTL in the first unit serpentine structure is disposed farthest from the second MSTL.

4. The structure of the micro-strip transmission line of claim 3,
   wherein the first horizontal MSTL in the second unit serpentine structure is disposed farthest from the first MSTL, and
   wherein the second horizontal MSTL in the second unit serpentine structure is disposed nearest to the first MSTL.

5. The structure of the micro-strip transmission line of claim 1, wherein each of the first and second horizontal MSTLs have the same width.

6. The structure of the micro-strip transmission line of claim 5, wherein each of the first and second vertical MSTLs have the same width.

7. The structure of the micro-strip transmission line of claim 6, wherein each of the first and second vertical MSTLs have the same length.

8. The structure of the micro-strip transmission line of claim 7, wherein a difference between mutual capacitance and mutual inductance is reduced by adjusting a section length D of the first and second unit serpentine structures in the length direction of the first MSTL.

9. The structure of the micro-strip transmission line of claim 7, wherein the second horizontal MSTL in the second unit serpentine structure is disposed at the same position as the second horizontal MSTL in the first unit serpentine structure.

10. The structure of the micro-strip transmission line of claim 7, wherein the same width of the first and second vertical MSTLs is between approximately 0.1 to 5 times the same width of the first and second horizontal MSTLs.

11. The structure of the micro-strip transmission line of claim 7, wherein the lengths of the first and second vertical MSTLs is between approximately one to seven times the same width of the first and second horizontal MSTLs.

12. The structure of the micro-strip transmission line of claim 7, wherein the width of the first horizontal MSTL is equal to the width of the first vertical MSTL.

13. The structure of the micro-strip transmission line of claim 12, wherein the length of the first horizontal MSTL is equal to the length of the second horizontal MSTL, wherein the width of the first vertical MSTL equals approximately 14 mils, wherein the section length of the first unit serpentine structure equals approximately 80 mils, and wherein the section length of the second unit serpentine structure equals approximately 80 mils.

14. The structure of the micro-strip transmission line of claim 1, further comprising at least one third MSTL comprising a third unit serpentine structure which is spaced apart from and parallel with the first and second MSTLs.

* * * * *